United States Patent
Rantala et al.

(10) Patent No.: US 7,514,709 B2
(45) Date of Patent: Apr. 7, 2009

(54) ORGANO-SILSESQUIOXANE POLYMERS FOR FORMING LOW-K DIELECTRICS

(75) Inventors: Juha T. Rantala, Espoo (FI); Jyri Paulasaari, Turku (FI); Janne Kylmä, Helsinki (FI)

(73) Assignee: Silecs Oy, Espoo (FI)

( * ) Notice: Subject to any disclaimer, the term of this patent is extended or adjusted under 35 U.S.C. 154(b) by 294 days.

(21) Appl. No.: 10/552,663

(22) PCT Filed: Apr. 13, 2004

(86) PCT No.: PCT/FI2004/000223

§ 371 (c)(1),
(2), (4) Date: Oct. 11, 2005

(87) PCT Pub. No.: WO2004/090019

PCT Pub. Date: Oct. 21, 2004

(65) Prior Publication Data

US 2006/0180900 A1 Aug. 17, 2006

Related U.S. Application Data

(60) Provisional application No. 60/531,672, filed on Dec. 23, 2003, provisional application No. 60/461,820, filed on Apr. 11, 2003.

(30) Foreign Application Priority Data

Apr. 9, 2004 (TW) .............................. 93109843 A

(51) Int. Cl.
*H01L 29/08* (2006.01)

(52) U.S. Cl. ............................ 257/40; 257/642; 438/99; 438/725; 438/778; 438/781

(58) Field of Classification Search ................... 257/40, 257/642; 438/99, 725, 778, 781
See application file for complete search history.

(56) References Cited

U.S. PATENT DOCUMENTS

| | | | |
|---|---|---|---|
| 6,242,339 B1 | 6/2001 | Aoi | 438/623 |
| 6,348,240 B1 | 2/2002 | Calvert et al. | 427/539 |
| 2003/0021967 A1 * | 1/2003 | Sagiv et al. | 428/209 |
| 2005/0064726 A1 * | 3/2005 | Reid et al. | 438/778 |

FOREIGN PATENT DOCUMENTS

| | | |
|---|---|---|
| JP | 2000-302791 A | 10/2000 |
| SU | 732296 | 5/1980 |
| SU | 767139 | 9/1980 |
| WO | 03/015129 A2 | 2/2003 |
| WO | 03/059990 A1 | 7/2003 |

* cited by examiner

*Primary Examiner*—Matthew Smith
*Assistant Examiner*—Colleen E Rodgers
(74) *Attorney, Agent, or Firm*—Kubovcik & Kubovcik

(57) ABSTRACT

A low dielectric constant polymer, comprising monomeric units derived from a compound having the general formula I $(R^1-R^2)_n-Si-(X^1)_{4-n}$, wherein each $X^1$ is independently selected from hydrogen and inorganic leaving groups, $R^2$ is an optional group and comprises an alkylene having 1 to 6 carbon atoms or an arylene, $R^1$ is a polycycloalkyl group and n is an integer 1 to 3. The polymer has excellent electrical and mechanical properties.

22 Claims, No Drawings

ORGANO-SILSESQUIOXANE POLYMERS FOR FORMING LOW-K DIELECTRICS

This application is a 371 of international application PCT/FI2004/000223, which claims priority based on U.S. provisional patent application Nos. 60/461,820 and 60/531,672 and Taiwanese patent application No. 93109843 filed Apr. 11, 2003, Dec. 23, 2003, and Apr. 9, 2004, respectively, which are incorporated herein by reference.

BACKGROUND OF THE INVENTION

1. Field of the Invention

The present invention relates to hybrid silsesquioxane polymers suitable as low-k dielectrics in integrated circuits (IC's) and for other similar applications. In particular, the invention concerns a composition and processing method for thin films comprising polymer compositions of organic-inorganic hybrid materials.

2. Description of Related Art

Built on semiconducting substrates, integrated circuits comprise millions of transistors and other devices, which communicate electrically with one another and with outside packaging materials through multiple levels of vertical and horizontal wiring embedded in a dielectric material. Within the multilayer metallization structure, "vias" make up the vertical wiring, whereas "interconnects" form the horizontal wiring. Fabricating the metallization can involve the successive depositing and patterning of multiple layers of dielectric and metal to achieve electrical connection among transistors and to outside packaging material. The patterning for a given layer is often performed by a multi-step process comprising layer deposition, photoresist spin, photoresist exposure, photoresist develop, layer etch, and photoresist removal on a substrate. Alternatively, the metal may sometimes be patterned by first etching patterns into a layer of a dielectric material, filling the pattern with metal, then subsequently chemically/mechanically polishing the metal so that the metal remains embedded only in the openings of the dielectric. As an interconnect material, aluminum has been utilized for many years due to its high conductivity, good adhesion to $SiO_2$, known processing methods (sputtering and etching) and low cost. Aluminum alloys have also been developed over the years to improve the melting point, diffusion, electromigration and other qualities as compared to pure aluminum. Spanning successive layers of aluminum, tungsten has traditionally served as the conductive via plug material.

In IC's, silicon dioxide, having a dielectric constant of around 4.0, has been the dielectric of choice, used in conjunction with aluminum-based and tungsten-based interconnects and via for many years.

The drive to faster microprocessors and more powerful electronic devices in recent years has resulted in very high circuit densities and faster operating speeds which—in turn—have required that higher conductivity metals and lower-k dielectrics (preferably below 3.0, more preferably below 2.5 dielectric constant) be used. In the past few years, VLSI (and ULSI) processes have been moving to copper damascene processes, where copper (or a copper alloy) is used for the higher conductance in the conductor lines and a spin-on or CVD process is used for producing low-k dielectrics which can be employed for the insulating material surrounding the conductor lines. To circumvent problems with etching, copper along with a barrier metal is blanket deposited over recessed dielectric structures consisting of interconnect and via openings and subsequently polished in a processing method known as the "dual damascene." The bottom of the via opening is usually the top of an interconnect from the previous metal layer or, in some instances, the contacting layer to the substrate.

In addition to being lithographically patternable, the dielectric IC material should be easy to deposit or form, preferably at a high deposition rate and at a relatively low temperature. Once the material has been deposited or formed, it should also be readily patterned, and preferably patterned with small feature sizes if needed. The patterned material should preferably have low surface and/or sidewall roughness. It might also be desirable that such materials be hydrophobic to limit uptake of moisture (or other fluids), and be stable with a relatively high glass transition temperature (not degrade or otherwise physically and/or chemically change upon further processing or when in use).

Summarizing: aside from possessing a low dielectric constant, the ideal dielectric should have the following properties:

1. High modulus and hardness in order to bind the maze of metal interconnects and vias together as well as abet chemical mechanical polishing processing steps.
2. Low thermal expansion, typically less than or equal to that of metal interconnects.
3. Excellent thermal stability, generally in excess of 400° C.
4. No cracking, excellent fill and planarization properties
5. Excellent adhesion to dielectric, semiconductor, and metal materials.
6. Sufficient thermal conductivity to dissipate joule heating from interconnects and vias.
7. Material density that precludes absorption of solvents, moisture, or reactive gasses.
8. Allows desired etch profiles at very small dimensions.
9. Low current leakage, high breakdown voltages, and low loss-tangents.
10. Stable interfaces between the dielectric and contacting materials.

By necessity, low-k materials are usually engineered on the basis of compromises. Silicate-based low-k materials can demonstrate exceptional thermal stability and usable modulus but can be plagued by brittleness and cracking. Organic materials; by contrast, often show improved material toughness, but at the expense of increased softness, lower thermal stability, and higher thermal expansion coefficients.

Porous materials sacrifice mechanical properties and possess a strong tendency of absorbing chemicals used in semiconductor fabrication leading to reliability failures. Furthermore, these porous materials are mesoporous or micro porous with pore diameters in excess of 2 nm and pore volumes greater than 30%. Fluorinated materials can induce corrosion of metal interconnects, rendering a chip inoperative. Generally, the mechanical robustness and thermal conductivity of low-k materials is lower than the corresponding properties of their pure silicon dioxide analogues, making integration into the fabrication flow very challenging.

Further, known materials comprising exclusively inorganic bonds making up the siloxane matrix are brittle and have poor elasticity at high temperatures.

Organosiloxane materials are typically deposited via spin-on processing, however Chemical Vapor Deposition (CVD) is also a viable technique for the deposition of these materials. For example, published International Patent Application No. WO03/015129 discloses organosilicone low-k dielectric precursors, which are useful for producing porous, low-k dielectric, SiOC thin films, wherein the organosilicon precursor comprises at least one cleavable, organic functional group that, upon activation, rearranges, decomposes and/or is cleaved-off as a highly volatile liquid and/or gaseous byproduct. Other organosilicone precursors comprising Si—O—C-in-ring cyclic siloxane compounds for use as precursors for forming insulator films by CVD are described in U.S. Pat. No. 6,440,876. When these siloxane precursors are contacted with the surface of a semiconductor or integrated circuit, they will react with the wafer surface forming a dielectric film. By ring-opening polymerization of these cyclic compounds, a dielectric film or layer will be formed.

U.S. Pat. No. 6,242,339 discloses an interconnection structure, in which a phenyl group, bonded to a silicon atom, is introduced into the silicon dioxide of the organic-containing silicon dioxide to produce a material suitable as an interlevel insulating film. Such a film can be processed just as easily as a conventional CVD oxide film; it has a relative dielectric constant as low as that of a hydrogen silsesquioxane (HSQ) film, and can adhere strongly to an organic film, an oxide film or a metal film. According to the patent, the number of devices that can be integrated within a single semiconductor integrated circuit can be increased without modification of the conventional semiconductor device manufacturing process to provide a high-performance semiconductor integrated circuit, operative at high speed and with lower power dissipation.

On the other hand, there are several examples of organosiloxane low-k materials made by spin-on deposition techniques. Spin-on low-k materials known in the prior art are mainly based on methyl- or phenyl-substituted organosiloxanes and combinations thereof. There are also some examples of adamantyl-substituted organosiloxanes.

The use of these types of polymers results, however, in fundamental problem due to their polarizability nature. The methyl-based siloxanes (also known as silsesquioxanes) will give relatively low electronic dielectric constant (polarizability), more specifically approximately 1.88, but—by contrast—their orientational dielectric constant (polarizability) is high, i.e., approximately 0.7, which significantly increases the total dielectric constant measured at low frequencies (10 kHz-10 GHz). Again, phenyl-based organosiloxanes have higher electronic dielectric constant (polarizability), i.e., approximately 2.4, but their orientational dielectric constant (polarizability) is lower (approximately 0.4) due to a relatively lower content of permanent dipoles in the material matrix. Therefore, the total dielectric constant cannot reach values close to 2.5 or lower, when ionic dielectric constant (polarizability) of approximately 0.15-0.3 is included, without the introduction of porosity (air having a dielectric constant of 1) into the film matrix. Moreover, the porous materials that are currently reaching a dielectric constant of less than 2.5 are typically highly porous, which makes the integration of such materials into the semiconductor device very difficult.

A particular problem with the adamantyl-substituted siloxanes known in the art is that they have been produced from alkoxy-precursors, which leave alkoxide residues in the matrix of the material. Such residues greatly impair the use and properties of the materials in particular as regards their dielectric properties. If residual alkoxides remain in the matrix, they tend to react over time and change materials properties by forming contaminating alcohol and water into the matrix. Such oxygenates decrease dielectric and leakage current behavior of the material. In addition, residual alkoxides, such as ethoxide-based materials, cause a dangling bond effect that causes higher leakage current for the material. Further, there are no industrially viable processes for producing suitable adamanlyl-substituted siloxane precursors.

Thus, the prior art contains no examples of dielectric materials for semi-conductor manufacture, which have desired properties of low dielectric constant with low controlled micro porosity, high thermal stability, and low cost. Further, there is a need for new precursors for hybrid organo-silsequioxane polymers.

SUMMARY OF THE INVENTION

It is an aim of the present invention to eliminate disadvantages of the prior art and to improve the dielectric constant performance of organosiloxane material compositions by providing novel polymer films, which have a low dielectric constant and excellent mechanical and thermal properties.

It is a second object of the invention to provide methods of producing novel poly(organo siloxane) compositions, which are suitable for the preparation of thin films having low dielectric constant.

Materials providing dielectric constant values of <2.5 and even <2.3 are also claimed.

It is a third object of the invention to provide a method of processing the new materials polymers by spin-on deposition methods.

A fourth object of the invention is to provide a method of processing the new materials by Chemical Vapor Deposition (CVD) methods.

Still, a fifth object of the invention is to apply above mentioned precursor and polymers in a rapid thermal anneal process wherein dielectric constant is further reduced.

These and other objects, together with the advantages thereof over the known dielectric thin films and methods for the preparation thereof, which shall become apparent from specification which follows, are accomplished by the invention as hereinafter described and claimed.

The present invention is based on the finding that by incorporating a large portion of an organic moiety into a hybrid organo-silsequioxane polymer, novel low dielectric constant polymer films having excellent mechanical and thermal properties can be obtained. Such materials are preferably produced from polycycloalkyl-substituted siloxanes, in particular from polycycloalkyl-substituted siloxanes, which are substantially free of any oxygenate impurities that may impair the dielectric properties of the dielectric material.

Polycycloalkyl siloxane precursors used according to the invention for producing dielectric polymer are typically compounds, which comprise an organic moiety, formed by at least two rings. Preferably the organic moiety comprises a plurality of rings, e.g. three or more aliphatic rings, formed by covalently bound atoms, which define a volume. Such compounds can be called "cage" compounds in the sense that a straight line draw between any point within the volume to any point outside the compound will always pass through one ring of the molecule. The precursors comprise an inorganic moiety formed by a silicon atom, which is bound to the organic moiety either directly or indirectly through a linker compound. Further the silicon atom bears at least one cleavable inorganic substituent, which will form a leaving group when the precursor is polymerized, or a proton. The substituent can be cleaved, in particular, by hydrolysis.

According to a preferred embodiment, the precursor has the general formula I

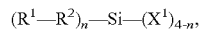

$$(R^1\text{—}R^2)_n\text{—}Si\text{—}(X^1)_{4-n}, \qquad I$$

wherein
each $X_1$ is independently selected from hydrogen and inorganic leaving groups,
$R_2$ is an optional group and comprises alkylene having 1 to 6 carbon atoms or arylene,
$R_1$ is a polycycloalkyl group and n is an integer 1 to 3

Of the above compounds, adamantyl trihalosiloxane and adamantyl silane are particularly interesting because they can now be economically produced at high yield and purity by a novel chemical process involving as a key intermediate adamantyl dehydrate having the formula

Specific preferred compounds include the following: adamantyl trichlorosilane, adamantylpropyl trichlorosilane, 3,5,7-trifluoroadamantyl trichlorosilane, 3,5,7-trifluoromethyladamantyl trichlorosilane and adamantylphenyl trichlorosilane.

The invention is also based on the finding that using polymers, which comprise organic residues derived from the above-described polycycloalkyl-substituted siloxanes in combination with residues derived from conventional precursors of dielectric polymers, such as alkyl-, aryl- and/or vinyl-substituted siloxanes, novel composite materials having excellent mechanical and dielectrical properties are produced. The properties of the composites are, in fact, better than those provided for by either of the homopolymers as such.

More specifically, the invention is mainly characterized by what is stated in the characterizing parts of claims 1, 22, 45 and 47.

Considerable advantages are achieved by the invention. Thus, nonporous materials having a porosity volume of less than 25% and a pore radius of approximately 1 nm or less, can be produced. These materials have a relative dielectric constant of less than 2.6 and high elasticity (Young's modulus 4 GPa or higher). By using polycycloalkyl siloxanes as comonomers together with conventionally used alkyl, vinyl and/or aryl siloxanes in the preparation of hybrid organo-silsequioxane polymers, it is possible to produce materials having a desired combination of electrical and mechanical properties.

Next, the invention will be examined in more detail with the help of a detailed description and with reference to the attached drawing and a number of chemical working examples.

DETAILED DESCRIPTION OF THE INVENTION

The present innovation relates to organosiloxane precursor and polymers, whose orientational and electronic polarizabilities result in a lower total dielectric constant than know in the prior art. Especially, the innovation relates to the use of organo-rich moieties that reduces the relative content of permanent dipoles in the film of the formed film matrix. In siloxane, the permanent dipoles of the polymers are mainly due to oxygen atoms in Si—O—Si bridges. When silane precursors containing polycyclic alkyl moieties are used for the formation of siloxane polymers, the organic content of the film is increased and, therefore, the content of carbon related oxygen is significantly reduced compared to siloxane polymers formed from precursors containing small alkyl groups. Examples of the latter kind of precursors are the methyl-substituted siloxanes. By "polycyclic alkyl moiety" we mean, for example, an adamantyl group or a similar cage compound, which is attached to silicon by (at least one) covalent bond. Thus, for example, if each silicon atom in the deposition polymer matrix contains one relative large organic group, in case of adamantyl, the atomic ratio of carbon to oxygen is increased. Thus, a conventional siloxane polymer contains significantly more permanent dipoles than a siloxane polymer made of adamantyl containing precursors. This difference in the content of permanent dipoles affects orientational polarizability so that the orientational dielectric constant can be as low as 0.3 to 0.2 for the siloxane materials made of adamantyl substituted precursors whereas an orientational dielectric constant for conventional siloxane low-k material is typically 0.7 or higher.

On the other hand, higher carbon content materials have a tendency of yielding a higher electronic polarizability especially when carbon is non-fluorinated carbon. Therefore, for example, an adamantyl siloxane polymer, in which each silicon atom contains one adamantyl group, gives an electronic dielectric constant of 2.25, whereas a similar polymer having a methyl group attached to the silicon instead results in an electronic dielectric constant of 1.89, provided that both of the materials are fully dense.

Thus, it is important in course of innovation to use compositions in which the sum of electronic and orientational polarizabilities is minimized.

Therefore, according to one preferred embodiment of the present invention, organosiloxane polymers made of adamantyl and methyl residues containing precursors at specific molar ratios are provided. Six compositional examples including their electronic dielectric, orientational dielectric and total dielectric constants with variable adamantyl and methyl concentrations in the organosiloxane polymer are reported in Table 1. The material compositions are presented in molar ratios as in the deposition polymer stage. All compositions have an intramolecular porosity of approximately 15%.

TABLE 1

| Material | Electronic k | Orientational k | Total k | Organic content (wt-%) | Carbon content (at-%) | Oxygen content (at-%) |
| --- | --- | --- | --- | --- | --- | --- |
| 100 adamantyl - 0 methyl | 1.92 | 0.31 | 2.43 | 72.2 | 36.4 | 5.5 |
| 75 adamantyl - 25 methyl | 1.86 | 0.335 | 2.4 | 66.9 | 34.8 | 6.7 |
| 50 adamantyl - 50 methyl | 1.8 | 0.37 | 2.37 | 59.1 | 32.4 | 8.8 |
| 30 adamantyl - 70 methyl | 1.78 | 0.35 | 2.33 | 49.5 | 28.9 | 11.7 |
| 25 adamantyl - 75 methyl | 1.74 | 0.43 | 2.37 | 46.4 | 27.7 | 12.8 |
| 0 adamantyl - 100 methyl | 1.68 | 0.55 | 2.43 | 22.4 | 15.4 | 23.1 |

As will appear from the table, particularly good results are obtained when the organic content is in the range of 30 to 70 wt.-%, preferably about 40 to 60 wt.-%.

Similar results are obtained when polycyclic alkyl siloxanes are used as comonomers in combination with other alkyl siloxane derivatives as well as with vinyl siloxanes and aryl siloxanes (such as phenyl siloxane) and with mixtures thereof, e.g. with methyl, vinyl, phenyl siloxanes. As disclosed in the examples below, dielectric materials having interesting properties are obtained using about 10 to 50 mole-% of polycyclic alkyl siloxanes, about 30 to 80 mole-% alkyl siloxanes (in particular methyl siloxanes) and the rest, typically about 5 to 30 mole-% vinyl siloxanes/aryl siloxanes.

Thus, in general, the present invention provides novel polymer materials useful as low-k materials in dielectric applications, said materials comprising copolymers formed by copolymerisation of at least one comonomer having the formula $$(R^3\text{—}R^4)_n\text{—}Si\text{—}(X^2)_{4-n}, \quad\quad II$$

wherein
X² is hydrogen or a hydrolysable group selected from halogen, acyloxy, alkoxy and OH groups,
R⁴ is an optional group and comprises an alkylene having 1 to 6 carbon atoms or an arylene and
R³ is an alkyl having 1 to 16 carbon atoms, a vinyl having from 2 to 16 carbon atoms, a cycloalkyl having from 3 to 16 carbon atoms, an aryl having from 5 to 18 carbon atoms or a polycyclic alkyl group having from 7 to 16 carbon atoms, and
n is an integer 1-3, with at least one of the following silicon compounds:
a) a silicon compound having the general formula III $$X^3{}_{3-a}\text{—}SiR^5{}_b R^6{}_c R^7{}_d \quad\quad III$$

wherein X³ represents a hydrolyzable group; R⁴ is an alkenyl or alkynyl group, which optionally bears one or more substituents; R⁵ and R⁶ are independently selected from hydrogen, substituted or non-substituted alkyl groups, substituted or non-substituted alkenyl and alkynyl groups, and substituted or non-substituted aryl groups; a is an integer 0, 1 or 2; b is an integer a+1; c is an integer 0, 1 or 2; d is an integer 0 or 1; and b+c+d=3; is hydrolyzed;
b) a silicon compound having the general formula IV $$X^4{}_{3-e}\text{—}SiR^8{}_f R^9{}_g R^{10}{}_h \quad\quad IV$$

wherein X⁴ represents a hydrolyzable group; R⁸ is an aryl group, which optionally bears one or more substituents; R⁹ and R¹⁰ are independently selected from hydrogen, substituted or non-substituted alkyl groups, substituted or non-substituted alkenyl and alkynyl groups, and substituted or non-substituted aryl groups; e is an integer 0, 1 or 2; f is an integer e+1; g is an integer 0, 1 or 2; h is an integer 0 or 1; and f+g+h=3; and
c) a silicon compound having the general formula V $$X^5{}_{3-i}\text{—}SiR^{11}{}_j R^{12}{}_k R^{13}{}_l \quad\quad V$$

wherein X⁵ represents a hydrolyzable group; R¹¹ is a hydrogen or an alkyl group, which optionally bears one or more substituents; R¹² and R¹³ are independently selected from hydrogen, substituted or non-substituted alkyl groups, substituted or non-substituted alkenyl or alkynyl groups, and substituted or non-substituted aryl groups; i is an integer 0, 1 or 2; j is an integer i+1; k is an integer 0, 1 or 2; l is an integer 0 or 1; and j+k+l=3, with the proviso that copolymerization is carried out using at least one comonomer having the formula II, wherein R₃ is a polycyclic alkyl group having from 7 to 16 carbon atoms, in particular 9 to 15 carbon atoms.

Compounds corresponding to the above compounds a) to c) can also be designated by the more restricted general formula VI, $$(R^3\text{—}R^4)_n\text{—}Si\text{—}(X^2)_{4-n}, \quad\quad VI$$

wherein
X² is hydrogen or a hydrolysable group selected from halogen, acyloxy, alkoxy and OH groups,
R⁴ is an optional group and comprises an alkylene having 1 to 6 carbon atoms or an arylene and
R³ is an alkyl having 1 to 16 carbon atoms, a vinyl having from 2 to 16 carbon atoms, a cycloalkyl having from 3 to 16 carbon atoms or an aryl having from 5 to 18 carbon atoms,
and
n is an integer 1-3.

The alkyl groups of R³ have typically 1 to 6 carbon atoms, the vinyl groups have from 2 to 6 carbon atoms, and the aryl groups have 6 carbon atoms.

The molar ratio between monomeric units derived from compounds according to formula II and one or several monomeric unit derived from compounds of a formula III to VI is in the range of 25:75 to 75:25.

Compounds a) to c) are disclosed in more detail in our copending patent application PCT/FI03/00036, the disclosure of which is herewith incorporated by reference.

The present invention also relates to the use of readily hydrolysable adamantyl materials in organo-silsesquioxane polymers for forming low-k dielectrics. Precursors within the scope of the present invention include easily hydrolysable organochlorosilanes or organosilanes that result in better polymerization degrees than the similar organo-alkoxysilanes.

In connection with the invention, we have found that organoalkoxysilanes have a tendency of leaving residual alkoxides in the material matrix. Such residues greatly impair the use and properties of the materials in particular as regards their dielectric properties. If residual alkoxides remain in the matrix, they tend to react over time and change the properties of materials by forming contaminating alcohol and water into the matrix. These oxygenates impair dielectric and leakage current behavior of the material. In addition, residual alkoxides, such as ethoxide-based materials, cause a dangling bond effect that causes higher leakage current for the material. Moreover, alkoxy-based materials result in higher porosity and lower Young's modulus and hardness compared to well hydrolysable organochloro-silane and organosilanes. Therefore, the course of the invention is to utilize more easily hydrolysable organosilanes for dielectric thin film purposes.

The new polycycloalkyl siloxane precursors used according to the invention have the general formula I $$(R^1\text{—}R^2)_n\text{—}Si\text{—}(X^1)_{4-n}, \quad\quad I$$

wherein
each X¹ is independently selected from hydrogen and inorganic leaving groups,
R² is an optional group and comprises alkylene having 1 to 6 carbon atoms or arylene,
R¹ is a polycycloalkyl group and
n is an integer 1 to 3

By polymerizing a compound of formula I, a polymeric material is obtained which, in practice, is "free of silanols". This means, typically, that they have a silanol content of less than 0.5 wt-%.

The polymers for preparing the low dielectric constant material have an organic content of about 30 to 70 wt.-%, preferably higher than 48 wt-%.

The polycyclic alkyl group has from 9 to 16 carbon atoms, and it comprises preferably a cage compound (as defined above). Typical examples of such compounds are adamantyl and diadamantyl. The adamantyl or diadamantyl ring structure can be substituted with 1 to 3 alkyl substitutents, which optionally carry 1 to 6 halogen substitutents, e.g. chloro, fluoro or bromo.

In compounds according to formula I, the inorganic leaving group is preferably selected from halogens, such as chlorine, bromine or fluorine.

In the compounds according to the above formulas I and II, respectively, $R^3$ is preferably selected from alkyl groups having 1 to 6 carbon atoms, vinyl groups having from 2 to 6 carbon atoms, and aryl groups having 6 carbon atoms;

$R^1$ or $R^3$, respectively, is directly bonded to the silicon atom; and $R^1$ or $R^3$, respectively, is bonded to the silicon atom via an alkylene chain, in particular an alkylene chain selected from methylene, ethylene and propylene, or an arylene group, in particular phenylene.

As discussed above, compounds of formula I, which are a part of the compound of formula II, can be copolymerized with other monomers, such as the monomers of one or several of formulas II to VI.

The molar ratio between monomeric units derived from comonomers according to formula I and of formula II, is preferably in the range of 25:75 to 75:25.

However, it is also possible to produce polymers useful as dielectric, low-k materials by homopolymerization of compounds of the formula I.

The present invention provides novel poly(organosiloxane) materials, which can be hydrolyzed and condensed (alone or with one or more other compounds) into a hybrid material having a (weight average) molecular weight of from 500 to 100,000 g/mol. The molecular weight can be in the lower end of this range (e.g., from 500 to 5,000 g/mol, or more preferably 500 to 3,000 g/mol) or the hybrid material can have a molecular weight in the upper end of this range (such as from 5,000 to 100,000 g/mol or from 10,000 to 50,000 g/mol). In addition, it may be desirable to mix a hybrid material having a lower molecular weight with a hybrid material having a higher molecular weight. The hybrid material can be suitably deposited such as by spin-on, spray coating, dip coating, or the like, as will be explained in more detail below.

The present invention also concerns a method of forming a thin film having a dielectric constant of 2.5 or less, comprising hydrolyzing a first silicon compound having the formula I optionally with with a second silicon compound having the formula II to produce a siloxane material;

depositing the siloxane material in the form of a thin layer on a substrate; and curing the thin layer to form a film.

The present invention further relates to a method of lowering the dielectric constant of the optimized materials in terms of the by rapid thermal curing (RTC). In such a process, the dielectric material is cured (densified and/or crosslinked) by increasing the temperature of the material at a rate, which is at least 6 times faster than in conventional curing. As a result, the heating ramp (the time it takes to reach curing temperature) is steep. The actual curing time can also be shorter than conventionally. Typically, the curing time is one sixth of the conventional time in the same heating tool. However, the rapid cure step can also be followed by conventional longer cure. The temperature difference between the starting temperature and actual the curing temperature is at least 150° C. At larger temperature differences, lower dielectric constants are achieved due to changed microstructure of the film material. It is not the course of the invention to claim the changed microstructure, but the changes in the structures due to the RTC treatment are likely due to phase change between ordered and disordered microstructures in silicon dioxide part of the matrix that results less densely packed structure than can be obtained as slightly increased micro-porosity. Alternatively, the microstructure changes may also take a place between or within organic residues attached to the silicon or even between organic residues and silicon dioxide matrix. All these reactions to cause the microstructure changes may also take a place simultaneously.

According to a preferred embodiment of the above methods, a non-porous dielectric material is first provided by conventional processing, e.g. by a spin-on or CVD process.

The temperature (also called "the first temperature") of the typically paste-like material is in the range of 100 to 200° C. The material is free from intentionally incorporated free evaporating porogens in order to provide a nonporous dielectric material. The elastic modulus of the paste-like material is low. After the deposition of the material on a suitable support, in particular on a semiconductor substrate, the material can optionally be pretreated, as will be explained below in more detail, and then cured by a thermal curing process, in which the material is rapidly heated to an increased (second) temperature.

In the RTC method alternative, the temperature can be increased at an average rate of at least 1° C., preferably at least 10° C., in particular at least 30° C., per second. Thus, a densified nonporous dielectric material having an elastic modulus, which is greater than the elastic modulus of the starting material, can be obtained.

Accordingly, the polymerization and densification reactions of the material are activated in a rapid curing furnace so that relative dielectric constant of the dielectric film is lower than a predetermined value. Such a predetermined value corresponds to that of a conventional furnace, which means a furnace in which the material is heated at a rate of about 10 deg C. or less per minute and in which it is cured for extensive periods of at least 15 minutes, typically more than 30 minutes. By the RTC process, the dielectric constant of the same material will be reduced by more than 0.1 as a result of the rapid thermal curing. However, the RTC process can be followed by conventional type of heat treatment.

As mentioned above, the temperature difference between the second and the first temperature should be large, preferably it is at least 200° C., and in particular in the range of from 225 to 425° C., and most preferably at least 275° C.

However, it should be pointed out that the present materials can also be processed by conventional thermal processing.

The dielectric constant of the densified material is 2.60 or less, preferably 2.50 or less, in particular 2.40 or less. The CTE of the film is less than $25*10^{-6}$ 1/degC.

The material can be characterized as being "nonporous" which, in the present context means, in particular, that the porosity is low, typically less than 25%, preferably less than 20%, in particular less than 15% (by volume), and the average pore size is less than 5 nm, preferably less than 2 nm and in particular less than 1 nm. As a result of the processing, the electronic polarizability of the film is decreased more than 0.1 compared to a predetermined value obtained by conventional processing, as explained above.

As mentioned above, the nonporous dielectric material can be subjected to annealing or a similar pretreatment or post-treatment of heated to the second temperature, i.e. the actual curing temperature. Annealing is carried out, e.g., by a process in which the material is subjected to UV radiation, DUV radiation, Extreme UV radiation, IR radiation or e-beam radiation or a combination thereof. The annealed material is then subjected to curing at an elevated temperature in air, nitrogen, argon, forming gas or vacuum.

The pre-cure and rapid cure processes according to the present invention, result in a dielectric film free of silanols.

The annealed and cured (densified, crosslinked) material can be subjected to deposition of a second layer selected from a metal, a barrier, a liner or an additional dielectric layer.

Based on the above, the present invention provides a process for preparing a siloxane-based dielectric material on a semiconductor substrate by hydrolysis and condensation of corresponding reactants, applying the prepared compositions on a substrate in the form of a thin layer, patterning the film by selective radiation and developing the radiated film and curing the formed structure.

As an embodiment of the above process, the material above is processed first by introducing a monomeric or polymerized material on a semiconductor substrate by a spin-on or CVD method, and then forming a siloxane polymer film on the semiconductor substrate by activating polymerization and densification reactions by rapid curing processing so as to produce a material having a relative dielectric constant lower than 2.6, preferably less than 2.5, in particular less than 2.4. Typically the dielectric constant is between 2.0 and <2.6.

The pore size of the nonporous dielectric material is less than 2 nm, the co-efficient of thermal expansion less than 25 ppm/degC., and the thermal decomposition temperature higher than 450° C.

The electrically insulating material can be baked and patterned, with an electrically conductive material being deposited in removed areas of the patterned dielectric. The electrically conductive material comprises, for example, copper.

The above process is, e.g., a dual damascene process.

The deposition and patterning processes are described, for instance, in our earlier application PCT/FI03/00036, the disclosure of which is herewith incorporated by reference.

The following non-limiting examples illustrate the invention:

EXAMPLE 1

Precursor Material

Adamantyltrichlorosilane $C_{10}H_{15}SiCl_3$

Preparation Steps:
1. $C_{10}H_{16}+2Br_2 \rightarrow 1,3\text{-}C_{10}H_{14}Br_2+2HBr$
2. $1,3\text{-}C_{10}H_{14}Br_2+2Li \rightarrow C_{10}H_{14}+2LiBr$
3. $C_{10}H_{14}+HSiCl_3 \rightarrow C_{10}H_{15}SiCl_3$ 106.4 g of (0.781 mol) adamantane $C_{10}H_{16}$ was added to a 2000 ml vessel followed by 500 ml dichloromethane. The solution was heated up to 40° C. and 92 ml (286.95 g, 1.80 mol) bromine was added to the vessel followed by a small amount of $FeBr_3$ as catalyst. The solution was stirred at 40° C. for 15 hours.

Refluxing was stopped and solution washed with 500 ml of dilute HCl. A sodium thiosulfate solution was added to the vessel until the colour changed from red to brown. The organic layer was separated and evaporated to dryness. Crude 1,3-$C_{10}H_{14}Br_2$ was dissolved in hot n-hexane and filtered. The filtrate was placed in a refrigerator and crystallized; the obtained, purified 1,3-$C_{10}H_{14}Br_2$

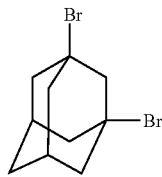

was filtered and dried in vacuum. Yield 192 g (84%).

58 g metallic lithium was added to a 2000 ml vessel followed by 500 ml $Et_2O$. 192 g (0.656 mol) adamantyl dibromide was dissolved in 1000 ml $Et_2O$ and the solution was added to the Li/$Et_2O$ solution at room temperature during an hour. The obtained solution was stirred for 15 hours at room temperature.

Then, the solution was decanted and $Et_2O$ evaporated. Adamantyl dehydrate was extracted from the remaining solid material by 3×200 ml n-pentane. n-pentane was evaporated. The remaining 1,3-dehydroadamantane

was used without further purification.

It was placed in a 1000 ml vessel and followed by 600 ml $HSiCl_3$ and 100 μl Speier's catalyst ($H_2PtCl_6$ in alcohol). The solution was heated up to 40° C. for two hours. After that, excess $HSiCl_3$ was distilled off and the remaining $C_{10}H_{15}SiCl_3$

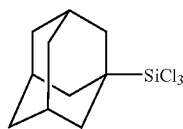

was purified by distillation. B.p. 95° C./1 mbar. Yield 123 g.

Adamantylsilane, an optional precursor, was manufactured as a derivative of adamantyl trichlorosilane.

Lithium aluminum hydride (6.18 g) and dry ether (80 mL) were placed in a rb flask. Adamantyl trichlorosilane (50.8 g), dissolved in ether (50 mL) was added dropwise in the magnetically stirred flask at rt. The reaction was allowed to reflux for 24 h. The solution was filtered, evaporated, and 1 mL $Et_3N$ in 30 mL pentane was then added and the upper layer was carefully decanted. After evaporation, the crude reaction product was distilled, giving 22 g of adamantylsilane (70%, bp. 40 . . . 50° C./2 mbar). $^1$H NMR: 1.95 (15H), 3.68 (3H). $^{13}$C NMR: 20.63, 28.86, 37.99, 40.61. $^{29}$Si NMR: −43.55 (q, Si—H: 190 Hz). Purity was found to be 95.7% by GC.

Adamantylchlorosilylbis(dimethylamine), another optional precursor, was manufactured as a derivative of adamantyl trichlorosilane.

Adamantyltrichlorosilane (5.59 g), $Et_3N$ (9.5 g) and dry ether (40 mL) were placed in a rb flask. Dimethylamine (3.05 g) was slowly bubbled into the solution at 0° C. in 45 minutes. The reaction was allowed to stir for 18 hours at rt. It was then filtered, and volatiles were removed by vacuum. Distillation at 88 . . . 98° C./1 mbar gave a fraction 4.54 g (76%). Purity was 97% by GC. GC/MS (m/z): 296 (62, [M]+), 243 (42), 151 (100), 135 (43), 108 (33), 79 (17), 74 (37). 1H NMR: 1.99 (3H), 2.08 (6H), 2.19 (6H), 2.74 (12H). 13C NMR: 28.63, 38.29, 39.07, 48.68. 14N NMR: −373.9. 29Si NMR: −10.16.

Other applicable precursors include (but are not limited to) the following:

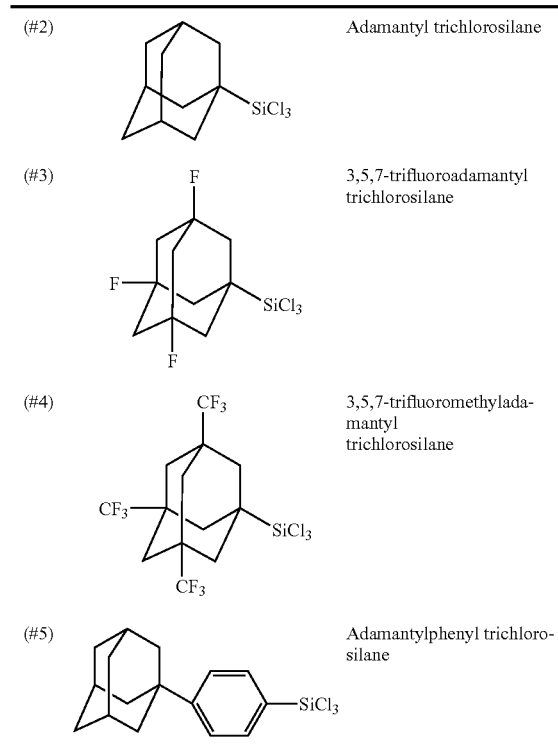

| (#2) | Adamantyl trichlorosilane |
| (#3) | 3,5,7-trifluoroadamantyl trichlorosilane |
| (#4) | 3,5,7-trifluoromethyladamantyl trichlorosilane |
| (#5) | Adamantylphenyl trichlorosilane |

In addition, an interesting precursor compound is formed by adamantylpropyl trichlorosilane.

EXAMPLE 2

Polymer Preparation

Material 1

Preparation of adamantysilanol intermediate. 7.0 g of adamantyltrichlorosilane (0.02595 mol) was dissolved in 56 ml acetone. The solution was transferred drop by drop into a solution containing acetone (70 ml), triethylamine (9.19 g, 0.0908 mol) and water (4.67 g, 0.2595 mol) within 20 min. During addition, the solution was vigorously mixed and the temperature of solution was maintained at room temperature (20° C., water bath). White precipitate was formed. After addition, the solution was mixed for an additional 20 hours at room temperature.

The solution was dried to dryness with a rotary evaporator (30° C., 200 mbar). 50 ml water was added and stirred for 10 min. After this, the solution was filtrated and the white powder obtained was flushed three times with 25 ml of water. The powder was dried under vacuum (40° C., 1 mbar), whereby 5.14 g of adamantylsilanol material was obtained that contained monomeric and oligomeric compounds.

Preparation of low-k resin. 5.0 g of adamantylsilanol was dissolved in 17.4 ml N,N-dimethylacetamide (DMAc) at 65° C. and the solution was cooled to room temperature. The solution was transferred drop by drop into a solution containing methyltrichlorosilane (15.8 g, 0.106 mol), vinyltrichlorosilane (2.0 g, 0.0123 mol), diethyl ether (77 ml), and triethylamine (8.7 g, 0.0867 mol) within 15 min. During addition, the solution was vigorously mixed and the temperature of the solution was maintained at room temperature (20° C., water bath). After addition, the solution was mixed for 1 hour at room temperature.

The obtained solution was dried to dryness under vacuum (40° C., 1 mbar, 30 min). 77 ml of dichloromethane (CM) was then added and the solution was placed in ice bath. 22 ml of hydrochloric acid (37%) was added drop by drop within 30 min. After that, the reaction mixture was stirred for 90 min at a temperature below 5° C. and at room temperature for 60 min.

The DCM phase was allowed to separate and was removed. HCl/water phase washed two times with 30 ml of DCM. DCM solutions were combined and extracted 8 times with 500 ml of water (pH 6). The combined DCM solution thus obtained was dried into dryness with a rotary evaporator (40° C., 10 mbar, 45 min) and finally at high vacuum (20° C., 1 mbar, 2 h). 6.0 g of material was obtained. Molecular weight ($M_p$) of the material was 17900 g/mol, determined by gel permeation chromatography (GPC) against commercially available narrow polystyrene standards The polymeric material was dissolved in 140 ml toluene containing 1 wt. % triethylamine. The solution was refluxed for 2 hours and then dried to dryness with a rotary evaporator (60° C., 10 mbar, 40 min) and finally with high vacuum (20° C., 1 mbar, 2 h). 5.78 g of material was obtained. Molecular weight ($M_p$) was 26 080 g/mol measured by GPC. $^1$H NMR showed the composition being 23 mole-% for adamantyl, 66 mole-% for methyl, and 11 mole-% for vinyl repeating units. $T_0$ was 460° C. and weight loss between 400-500° C. (heating rate 5° C./min) was 2.7% measured by thermal gravimetric analysis (TGA).

EXAMPLE 3

Polymer Material 1A—Alternative Method

Preparation of adamantylsilanol intermediate. Preparation of adamantylsilanol was made similarly as in Example 2, but tetrahydrofuran (THF) was used instead of acetone. Thus, 7.0 g of adamantyltrichlorosilane (0.02595 mol) was dissolved in 21 ml THF. The solution was transferred drop by drop into a solution containing THF (70 ml), triethylamine (9.19 g, 0.0908 mol), and water (4.67 g, 0.2595 mol) within 20 min. During addition, the solution was vigorously mixed and the temperature of the solution was maintained at room temperature (20° C., water bath). White precipitate was formed. After addition, the solution was mixed for a further 22 hours at room temperature.

The solution was dried to dryness with a rotary evaporator (35° C., 170 mbar). 50 ml water was added and stirred for 10 min. After this, the solution was filtrated and the obtained white powder was flushed three times with 25 ml of water. The powder was dried under vacuum (40° C., 1 mbar). 4.62 g of adamantylsilanol material was obtained that contained monomeric and oligomeric compounds.

EXAMPLE 4

Polymer Material 1B—Alternative Method 9.75 g of adamantylsilanol prepared in Example 1 was dissolved in 34 ml N,N-dimethylacetamide (DMAc) at 65° C., and the solution was cooled to room temperature. The solution was transferred drop by drop into a solution containing methyltrichlorosilane (30.1 g, 0.201 mol), vinyltrichlorosilane (4.3 g, 0.026 mol), diethyl ether (146 ml), and triethylamine (16.6 g, 0.164 mol) within 30 min. During addition, the solution was vigorously mixed and the temperature of the solution was maintained at room temperature (20° C., water bath). After addition, the solution was mixed for a further 3 hours at room temperature.

The solution was dried into dryness under vacuum (40° C., 1 mbar, 2 h). 150 ml of dichloromethane (DCM) was added and the solution thus obtained was placed in ice bath. 36 ml of hydrochloric acid (37%) was added drop by drop within 60 min. After the addition of the hydrochloric acid, the reaction mixture was stirred for 90 min below 5° C. and for 24 h at room temperature.

The DCM phase was allowed to separate and was collected. HCl/water phase washed two times with 60 ml of DCM. The DCM solutions were combined and extracted with 10 times with 200 ml of water (pH 6). The combined DCM solution was dried to dryness with a rotary evaporator (40° C., 10 mbar, 60 min) and finally under vacuum (20° C., 1 mbar, 60 min). 11.6 g of material was obtained. Molecular weight ($M_p$) was 27 610 g/mol measured by gel permeation chromatography (GPC).

The material was dissolved in 232 ml toluene containing 1 wt. % triethylamine. The solution was refluxed (oil bath temperature 150° C.) for 2 hours and then dried to dryness with a rotary evaporator (60° C., 10 mbar, 60 min) and finally with high vacuum (20° C., 1 mbar, 2 h). 11.8 g of material was obtained. Molecular weight ($M_p$) was 30 500 g/mol, measured by GPC. $^1$H NMR showed the composition being 27 mole-% for adamantyl, 62 mole-% for methyl, and 11 mole-% for vinyl repeating units. $T_0$ was 460° C. and weight loss between 400-500° C. (at a heating rate of 5° C./min), was 3.2% measured by thermal gravimetric analysis (TGA).

EXAMPLE 5

Polymer Material 1C—Alternative Method 3.6 g of low molecular weight material prepared in Example 3 was dissolved in 18 ml xylene containing 4 wt. % triethylamine. The solution was refluxed for 3 hours. Then, it was dried to dryness with a rotary evaporator (70° C., 10 mbar, 30 min) and finally with high vacuum (70° C., 1 mbar, 2 h). 3.45 g of material was obtained. The molecular weight ($M_p$) was 46 880 g/mol, measured by GPC.

EXAMPLE 6

Comparative Material 2B

A comparative material 2B was prepared having a similar compositional structure as polymer material 1B, but using organotrialkoxysilanes as precursors instead of the corresponding trichlorosilanes of Example 4. Thus, adamantyltriethoxysilanesilane, methyltriethoxysilane, and vinyltriethoxysilane were used in ratios that yielded similar final compositional concentrations of organo-functional moieties in the final polymer as presented in Example 4 for Polymer Material 1B. The precursors were dissolved in acetone and the solution thus obtained was placed in ice bath and 9.52 g of 0.5 M hydrochloric acid was added drop by drop within 50 min. During addition, the solution was vigorously stirred. After the addition, the solution was refluxed for another 3 hours. An excess amount of toluene was added and acetone was evaporated. An excess amount of water was added and the solution was allowed to stir for 10 minutes at room temperature. The toluene phase was allowed to separate and was removed. The solution was dried to dryness with a rotary evaporator and, finally, with high vacuum.

Material was dissolved in an extensive amount of toluene containing 1 wt. % triethylamine. The solution was refluxed for 1 hour, dried to dryness with rotary evaporator and finally with high vacuum. A homogenous polymer with yield of 65% was obtained. Molecular weight ($M_p$) was 21 840 g/mol measured by GPC.

EXAMPLE 7

Processing and Testing of Example Materials

Test Film IA

A test film was prepared from material 1B disclosed in Example 4 using spin-on deposition by applying 3000 rpm spinning speed and resulting in 500 nm thick film. The film was deposited on a n-type silicon wafer and pre-cured on a hot-plate for 5 minutes at 200° C. prior to final in a furnace treatment. The furnace anneal was done under nitrogen gas flow at 450° C. for 60 minutes. Dielectric constants were measured from MOS-capacitor (metal-insulator-semiconductor structure) type device. Applied measurement frequency was 100 kHz. Porosity was measured with porosity ellipsometer and Young's modulus and hardness by nanoindentation.

Test Film IB

A test film was prepared from material 1B explained in Example 4 by spin-on deposition by applying a 3000 rpm spinning speed and resulting in a 500 nm thick film. The film was deposited on an n-type silicon wafer and pre-cured on a hot-plate for 5 minutes at 200° C. prior to final treatment by rapid thermal anneal treatment. The rapid thermal anneal was done under vacuum at 450° C. for 5 minutes and a 30° C./second temperature ramp rate was utilized. Dielectric constants were measured from a MOS-capacitor (metal-insulator-semiconductor structure) type device. The applied measurement frequency was 100 kHz. Porosity was measured with porosity ellipsometer and Young's modulus and hardness by nanoindentation.

Test Film IIA

A test film was prepared from material 2B explained in Example 6 by spin-on deposition by applying a 3000 rpm spinning speed and resulting in a 500 nm thick film. The film was deposited on an n-type silicon wafer and pre-cured on a hot-plate for 5 minutes at 200° C. prior to final curing by furnace treatment. The furnace anneal was done under nitrogen gas flow at 450° C. for 60 minutes. Dielectric constants were measured from a MOS-capacitor (metal-insulator-semiconductor structure) type device. The applied measurement frequency was 100 kHz. Porosity was measured with porosity ellipsometer and Young's modulus and hardness by nanoindentation.

Test Film IIB

A test film was prepared from material 2B explained in Example 6 by spin-on deposition by applying a 3000 rpm spinning speed and resulting in a 500 nm thick film. The film was deposited on an n-type silicon wafer and pre-cured on a hot-plate for 5 minutes at 200° C. prior to final curing by rapid thermal anneal treatment. The rapid thermal anneal was done under vacuum at 450° C. for 5 minutes and a 30° C./second temperature ramp rate was utilized. Dielectric constants were measured from a MOS-capacitor (metal-insulator-semiconductor structure) type device. The applied measurement frequency was 100 kHz. Porosity was measured with porosity ellipsometer and Young's modulus and hardness by nanoindentation.

The results of the tested films are summarized in Table 2:

TABLE 2

| Film | Dielectric constant (10 kHz) | Porosity % | Young's modulus Gpa) | Hardness (GPa) | Leakage current (nA/cm2) |
|---|---|---|---|---|---|
| I.A. | 2.53 | 8 | 6.9 | 0.52 | 0.03 |
| I.B. | 2.32 | 17 | 6.5 | 0.49 | 0.05 |
| II.A. | 2.62 | 13 | 6.4 | 0.32 | 0.7 |
| II.B. | 2.42 | 28 | 3.8 | 0.19 | 1.2 |

Clearly, based on the comparative data, it is advantageous to use organo-chlorosilanes and their derivatives as starting materials or precursors since they result in better electrical properties, such as lower dielectric constant, with lower porosity as well as better mechanical performance. The residual silanol levels are also lower in the case of using organo-chlorosilanes as precursors than can be observed as significantly lower leakage current in actual tested devices. The better overall performance of organo-chlorosilanes derives from the fact that they are easily hydrolysed and polycondensed and, thus, results in purer polymer network that is free of silanol type impurities.

We claim:

1. A low dielectric constant polymer, comprising monomeric units derived from a compound having the general formula I $$(R^1-R^2)_n-Si-(X^1)_{4-n}, \quad I$$

wherein
each $X^1$ is independently selected from hydrogen and inorganic leaving groups,
$R^2$ is an optional group and comprises an alkylene having 1 to 6 carbon atoms or an arylene,
$R^1$ is adamantyl or diadamantyl substituted with 1 to 3 alkyl substitutents, which optionally carry 1 to 6 halogen substituents, and
n is an integer 1 to 3.

2. The polymer according to claim 1, wherein the organic content of the polymer is in the range of 30 to 70 wt.-%.

3. The polymer according to claim 2, wherein the organic content of the polymer is greater than 48 wt-%.

4. The polymer according to claim 1, wherein the inorganic leaving group is selected from halogens.

5. The polymer according to claim 1, obtainable by homopolymerization of compounds of the formula I.

6. The polymer according the claim 1, wherein the total sum dielectric components at 1 MHz is 2.50 or less.

7. The polymer according to claim 6, wherein the orientational dielectric constant of the polymer is 0.4 or less.

8. The polymer according the claim 6, wherein the total sum dielectric components at 1 MHz is 2.10 or less.

9. The polymer according 1, wherein the oxygen content of the polymer is less than 15 atomic %.

10. The polymer according to claim 1, wherein the dielectric constant of the dielectric material after curing is 2.50 or less.

11. The polymer according to claim 10, wherein the dielectric constant of the dielectric material after curing is 2.30 or less.

12. The polymer according to claim 1, wherein the porosity of the dielectric material is less than 20%.

13. The polymer according to claim 12, wherein the porosity of the dielectric material is less than 15%.

14. The polymer according to claim 1, wherein the average pore radius is less than 1 nm.

15. The polymer according to claim 1, wherein the Young's modulus of the film is higher than 4 GPa after curing.

16. The polymer according to claim 15, wherein the Young's modulus of the film is higher than 6 GPa after curing.

17. A low dielectric constant polymer, comprising monomeric units derived from a compound having the general formula I $$(R^1-R^2)_n-Si-(X^1)_{4-n}, \quad I$$

wherein
each $X^1$ is independently selected from hydrogen and inorganic leaving groups,
$R^2$ is an optional group and comprises an alkylene having 1 to 6 carbon atoms or an arylene,
$R^1$ is a polycycloalkyl group, and
n is an integer 1 to 3, which is obtainable by copolymerization of a compound of formula I with a compound of formula II $$(R^3-R^4)_n-Si-(X^2)_{4-n}, \quad II$$

wherein
$X^2$ is hydrogen or a hydrolysable group selected from halogen, acyloxy, alkoxy and OH groups,
$R^4$ is an optional group and comprises an alkylene having 1 to 6 carbon atoms or an arylene and
$R^3$ is an alkyl having 1 to 16 carbon atoms, a vinyl having from 2 to 16 carbon atoms, a cycloalkyl having from 3 to 16 carbon atoms, an aryl having from 5 to 18 carbon atoms or a polycyclic alkyl group having from 7 to 16 carbon atoms, and
n is an integer 1-3.

18. The polymer according to claim 17, wherein $R^3$ is selected from alkyl groups having 1 to 6 carbon atoms, vinyl groups having from 2 to 6 carbon atoms, and aryl groups having 6 carbon atoms.

19. The polymer according to claim 17, wherein the molar ratio between monomeric units derived from compounds according to formula I and of formula II is in the range of 25:75 to 75:25.

20. The polymer according to claim 17, wherein $R^1$ or $R^3$, respectively, is directly bonded to the silicon atom.

21. The polymer according to claim 17, wherein $R^1$ or $R^3$, respectively, is bonded to the silicon atom via an alkylene chain selected from methylene, ethylene and propylene, or an arylene group selected from phenylene.

22. The polymer according to claim 17, wherein the carbon content of the polymer is more than 25 atomic %.

* * * * *

UNITED STATES PATENT AND TRADEMARK OFFICE
CERTIFICATE OF CORRECTION

| | |
|---|---|
| PATENT NO. | : 7,514,709 B2 |
| APPLICATION NO. | : 10/552663 |
| DATED | : April 7, 2009 |
| INVENTOR(S) | : Juha T. Rantala, Jyri Paulasaari and Janne Kylmä |

It is certified that error appears in the above-identified patent and that said Letters Patent is hereby corrected as shown below:

Title page; item (86);

On the front page of the patent, the 371(c) date is listed as October 11, 2005 but should be listed as March 28, 2006.

Signed and Sealed this

Twenty-third Day of November, 2010

David J. Kappos
*Director of the United States Patent and Trademark Office*